US009689915B2

(12) United States Patent
Kasai et al.

(10) Patent No.: US 9,689,915 B2
(45) Date of Patent: Jun. 27, 2017

(54) AUTOMATED ATTACHING AND DETACHING OF AN INTERCHANGEABLE PROBE HEAD

(71) Applicant: FormFactor, Inc., Livermore, CA (US)

(72) Inventors: Toshihiro Kasai, Sagamihara (JP); Masanori Watanabe, Tokyo (JP); Yoichi Urakawa, Yokohama (JP)

(73) Assignee: FormFactor, Inc., Livermore, CA (US)

( * ) Notice: Subject to any disclaimer, the term of this patent is extended or adjusted under 35 U.S.C. 154(b) by 107 days.

(21) Appl. No.: 14/274,889

(22) Filed: May 12, 2014

(65) Prior Publication Data

US 2014/0340103 A1   Nov. 20, 2014

Related U.S. Application Data

(60) Provisional application No. 61/823,196, filed on May 14, 2013.

(51) Int. Cl.
*G01R 31/00* (2006.01)
*G01R 31/28* (2006.01)

(52) U.S. Cl.
CPC ..... *G01R 31/2887* (2013.01); *Y10T 29/49117* (2015.01)

(58) Field of Classification Search
CPC . G01R 1/04; G01R 1/67; G01R 1/433; G01R 31/2887; G01R 31/2889
See application file for complete search history.

(56) References Cited

U.S. PATENT DOCUMENTS 5,821,764 A * 10/1998 Slocum ................... G01R 1/04
324/756.03
6,292,003 B1    9/2001 Fredrickson et al.
(Continued)

FOREIGN PATENT DOCUMENTS

JP   07-231018   8/1995
JP   2000/150596  5/2000
(Continued)

OTHER PUBLICATIONS

International Search Report, PCT patent application PCT/US2014/037701, (WIPO) (Jan. 28, 2015), 5 pages.
(Continued)

*Primary Examiner* — Minh N Tang
(74) *Attorney, Agent, or Firm* — Lumen Patent Firm

(57) ABSTRACT

A probe card apparatus can comprise a tester interface to a test controller, probes for contacting terminals of electronic devices to be tested, and electrical connections there between. The probe card apparatus can comprise a primary sub-assembly, which can include the tester interface. The probe card apparatus can also comprise an interchangeable probe head, which can include the probes. The interchangeable probe head can be attached to and detached from the primary sub-assembly while the primary sub-assembly is secured to or in a housing of a test system. Different probe heads each having probes disposed in different patterns to test different types of electronic devices can thus be interchanged while the primary sub-assembly is secured to or in a housing of the test system.

8 Claims, 15 Drawing Sheets

(56) References Cited

U.S. PATENT DOCUMENTS

| | | | |
|---|---|---|---|
| 6,551,122 B2* | 4/2003 | Bosy | G01R 31/31721 |
| | | | 439/348 |
| 6,586,925 B2* | 7/2003 | Ramesh | G01R 1/0433 |
| | | | 324/750.19 |
| 6,590,381 B1* | 7/2003 | Iino | G01R 31/2887 |
| | | | 324/750.2 |
| 6,600,334 B1 | 7/2003 | Hembree et al. | |
| 7,102,367 B2 | 9/2006 | Yamagishi et al. | |
| 7,498,825 B2 | 3/2009 | Eldridge et al. | |
| 7,898,242 B2 | 3/2011 | Eldridge et al. | |
| 2004/0113643 A1 | 6/2004 | Kawaguchi et al. | |
| 2006/0186906 A1 | 8/2006 | Bottoms et al. | |
| 2014/0103948 A1 | 4/2014 | Huang et al. | |

FOREIGN PATENT DOCUMENTS

| | | |
|---|---|---|
| JP | 2009/016745 | 1/2009 |
| JP | 2012/119363 | 6/2012 |

OTHER PUBLICATIONS

Written Opinion of the International Searching Authority, PCT patent application PCT/US2014/037701, (WIPO) (Jan. 27, 2015), 7 pages.

International Preliminary Report on Patentability, PCT patent application PCT/US2014/037701, (WIPO) (Nov. 17, 2015), 8 pages.

* cited by examiner

AUTOMATED ATTACHING AND DETACHING OF AN INTERCHANGEABLE PROBE HEAD

CROSS REFERENCE TO RELATED APPLICATION(S)

This application is a non-provisional (and thus claims the benefit) of U.S. provisional patent application Ser. No. 61/823,196 (filed May 14, 2013), which is incorporated by reference herein in its entirety.

BACKGROUND

Probe card apparatuses are devices that can provide an interface between a tester for controlling testing of an electronic device and the electronic device. Embodiments of the present invention are directed to various improvements in probe card apparatuses including mechanisms and processes for automatically attaching and detaching interchangeable probe heads to/from a primary-sub-assembly of such a probe card apparatus.

SUMMARY

In some embodiments, a probe head can comprise electrical connectors on one side and electrical probes on another side, and the connections can be electrically connected to the probes. The probe head can also include a catch for interlocking with latch assemblies of a primary sub-assembly of a probe card apparatus while the probe head is in a latching position with respect to the primary sub-assembly. The interlocking of the latch assemblies and the catch can attach the probe head to the primary sub-assembly with the connectors of the probe head in electrical contact with corresponding electrical contacts of the primary sub-assembly.

In some embodiments a process for attaching a probe head to a primary sub-assembly to form a fully assembled probe card apparatus can include disposing the probe head on a first stage. The first stage can then move the probe head into a latching position with respect to the primary sub-assembly. The foregoing moving of the stage can automatically opening latch assemblies of the primary sub-assembly. The latch assemblies can then be closed thereby attaching the probe head to the primary sub-assembly.

In some embodiments, a process of detaching a probe head from a primary sub-assembly of a fully assembled probe card apparatus can include moving a stage toward the probe head. During the foregoing movement, the stage can contact and thereby automatically opening latch assemblies that attach the probe head to the primary sub-assembly, which can automatically release the probe head from the primary sub-assembly to the stage. The stage can then move the now released probe head away from the primary sub-assembly.

BRIEF DESCRIPTION OF THE DRAWINGS

FIG. 2 also illustrates a side, cross-sectional view of a tray for attaching the probe head to and detaching the probe head from the primary sub-assembly according to some embodiments of the invention.

DETAILED DESCRIPTION OF EXEMPLARY EMBODIMENTS

Figure 1:
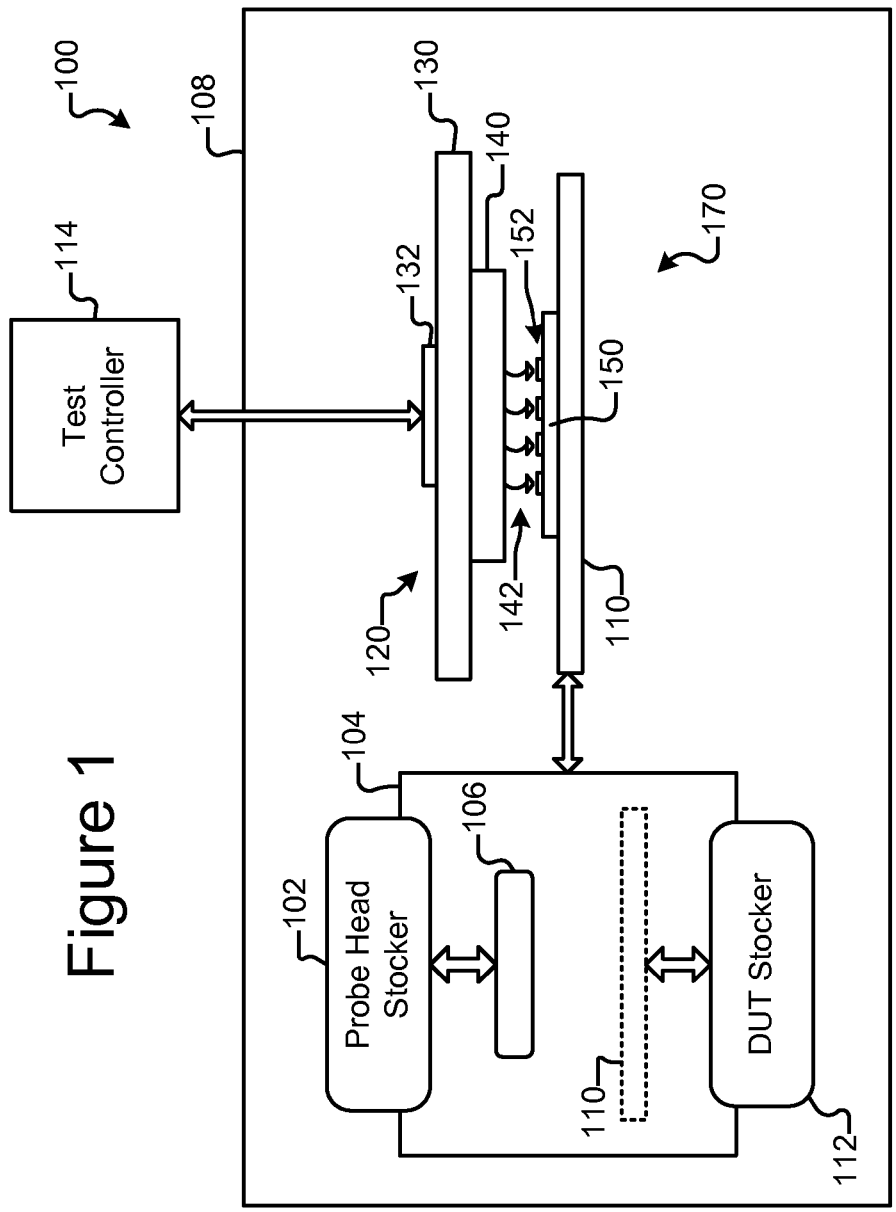
FIG. 1 is a block diagram of a test system for testing electronic devices according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the figures may show simplified or partial views, and the dimensions of elements in the figures may be exaggerated or otherwise not in proportion. In addition, as the terms "on," "attached to," "connected to," "coupled to," or similar words are used herein, one element (e.g., a material, a layer, a substrate, etc.) can be "on," "attached to," "connected to," or "coupled to" another element regardless of whether the one element is directly on, attached to, connected to, or coupled to the other element or there are one or more intervening elements between the one element and the other element. Similarly, as the word "contact" or similar words are used herein, one element can "contact" another element regardless of whether the one element directly contacts the other element or the one element directly contacts and thereby moves one or more intervening elements into contact with the other element. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. The term "substantially" thus allows for minor, insignificant variations from an absolute or perfect state, dimension, measurement, result, or the like such as would be expected by a person of ordinary skill in the field but that do not appreciably affect overall performance. When used with respect to numerical values or parameters or characteristics that can be expressed as numerical values, "substantially" means within ten percent. The term "ones" means more than one. The term "disposed" encompasses within its meaning "located."

In some embodiments of the invention, a probe card apparatus can comprise a tester interface to a test controller, probes for contact terminals of electronic devices (e.g., semiconductor dies) to be tested, and electrical connections there between. The probe card apparatus can comprise a primary sub-assembly and an interchangeable probe head. The primary sub-assembly can include the tester interface, and the interchangeable probe head can include the probes. The interchangeable probe head can be attached to and detached from the primary sub-assembly while the primary sub-assembly is secured to or in a housing of a test system. Different probe heads each having probes disposed in different patterns to test different types of electronic devices can thus be interchanged while the primary sub-assembly is secured to or in a housing of the test system.

FIG. 1 illustrates a simplified block diagram of a test system 100 for testing electronic devices. Hereinafter an electronic device that is to be tested, is undergoing testing, or has been tested in the system 100 is referred to as a "device under test" or a "DUT" 150. As shown, the test system 100 can comprise a test controller 114, a stocker 102 for interchangeable probe heads, a staging area 104, a stocker 112 for DUTs, and a probe card apparatus 120.

The probe card apparatus 120 can comprise a primary sub-assembly 130 that includes an electrical interface 132 to the test controller 114, and the probe card apparatus 120 can also include an interchangeable probe head 140 that includes electrically conductive probes 142. While the primary sub-assembly 130 is secured to the housing 108 (e.g., an attachment structure (not shown) inside the housing 108) in a testing area 170 and the probe head 140 is attached to the primary sub-assembly 130, a DUT 150 disposed on a DUT stage 110 in the testing area 170 can be moved to bring the probes 142 of the probe head 140 into contact with input and/or output terminals 152 of the DUT 150. The test controller 114 can then provide test signals through the probe card apparatus 120 to the DUT 150, and the test controller 114 can sense, also through the probe card apparatus 120, response signals generated by the DUT 150. Although shown outside of the housing 108, the test controller 114 can be located, in whole or in part, inside the housing 108 or even on the primary sub-assembly 130 of the probe card apparatus 120.

DUTs 150 that are to be tested can be placed in the DUT stocker 112. A specific DUT 150 can then be moved from the DUT stocker 112 to a DUT stage 110 in the staging area 104. The DUT stage 110 can then be moved from the staging area 104 to the testing area 170, where the stage 110 can move the DUT 150 into contact with the probe 142 as discussed above. A tested DUT 150 can be moved on the DUT stage 110 back to the staging area 104 and then to the stocker 112 from where the tested DUT 150 can be removed from the test system 100.

Different types of DUTs 150 can have different numbers and patterns of terminals 152. There can be a different probe head 140 for each of the different types of DUTs 150 to be tested in the test system 100. For example, each type of probe head 140 can have a number and pattern of probes 142 that correspond to one of the DUT types 150 to be tested in the test system 100. As will be seen, the primary sub-assembly 130 can be configured such that different ones of the interchangeable probe heads 140 can be quickly and automatically attached and detached from the primary sub-assembly 130 while the primary sub-assembly 130 remains secured to the housing 108 in the test area 170.

Different types of probe heads 140 can be placed into the probe head stocker 102. When a new probe head 140 is to replace the probe head 140 attached to the primary sub-assembly 130, a probe head tray 106 can move from the staging area 104 to the test area 170. The DUT stage 110 can have been previously moved away from the probe card apparatus 120 (e.g., out of the test area 170). The tray 106 can then engage the probe head 140 and the primary sub-assembly 130, which can be configured to automatically release the probe head 140 to the tray 106. The tray 106 can then move the probe head 140 from the testing area 170 back to the staging area 104 from where the probe head 140 can be restocked in the probe head stocker 102. A new and different type of probe head 140 can then be moved from the stocker 102 to the tray 106, and the tray 106 can move the new probe head 140 to the testing area 170. There, the tray 106 can engage the primary sub-assembly 130, which can automatically attach the new probe head 140 to the primary sub-assembly 130. The tray 106 can then be moved back to the staging area 104, and a new DUT 150 can be tested with the now newly configured probe card apparatus 130.

Figure 2:
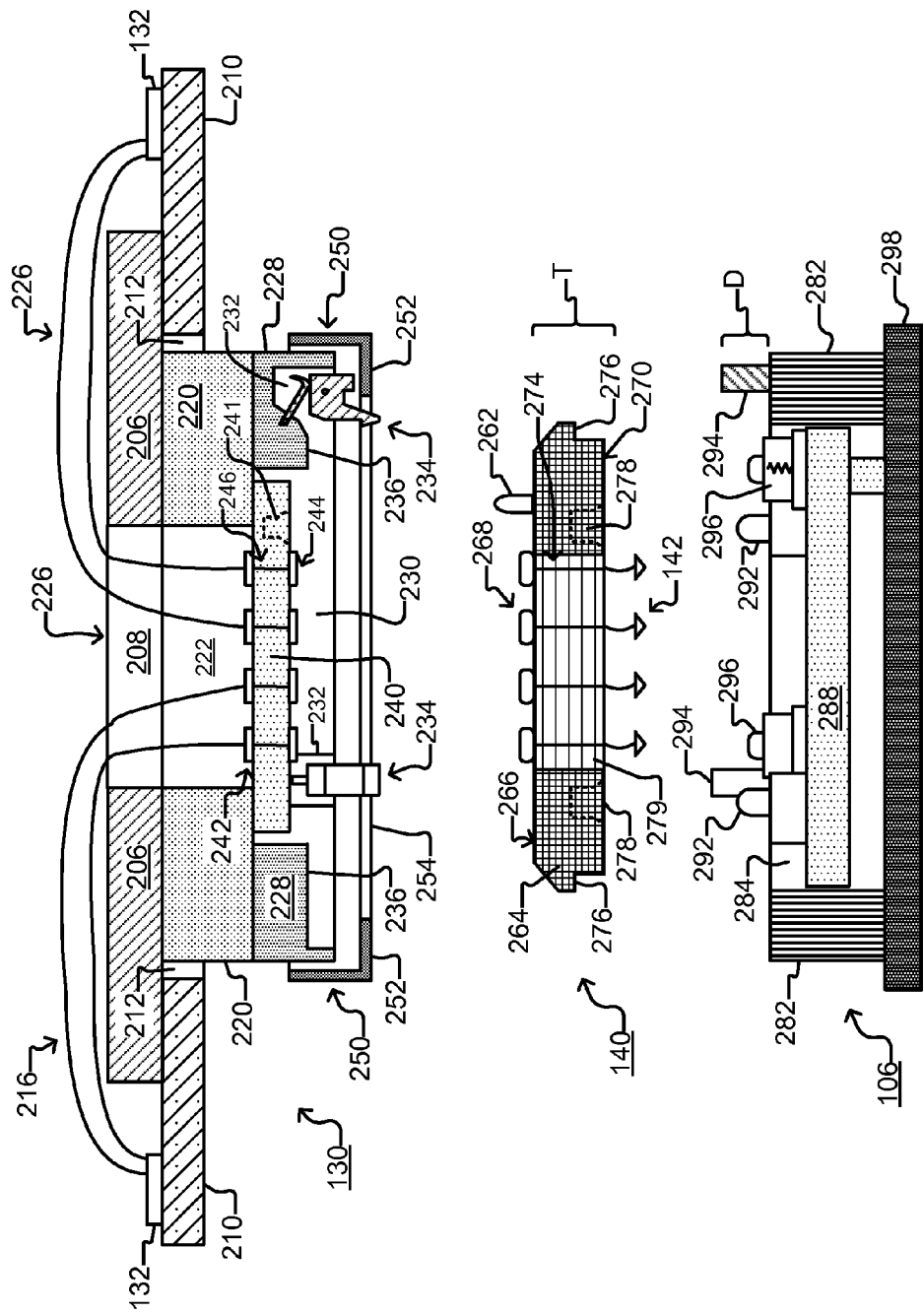
FIG. 2 illustrates a side, cross-sectional view of an example of a probe card apparatus comprising a primary sub-assembly and an interchangeable probe head.
Figure 3:
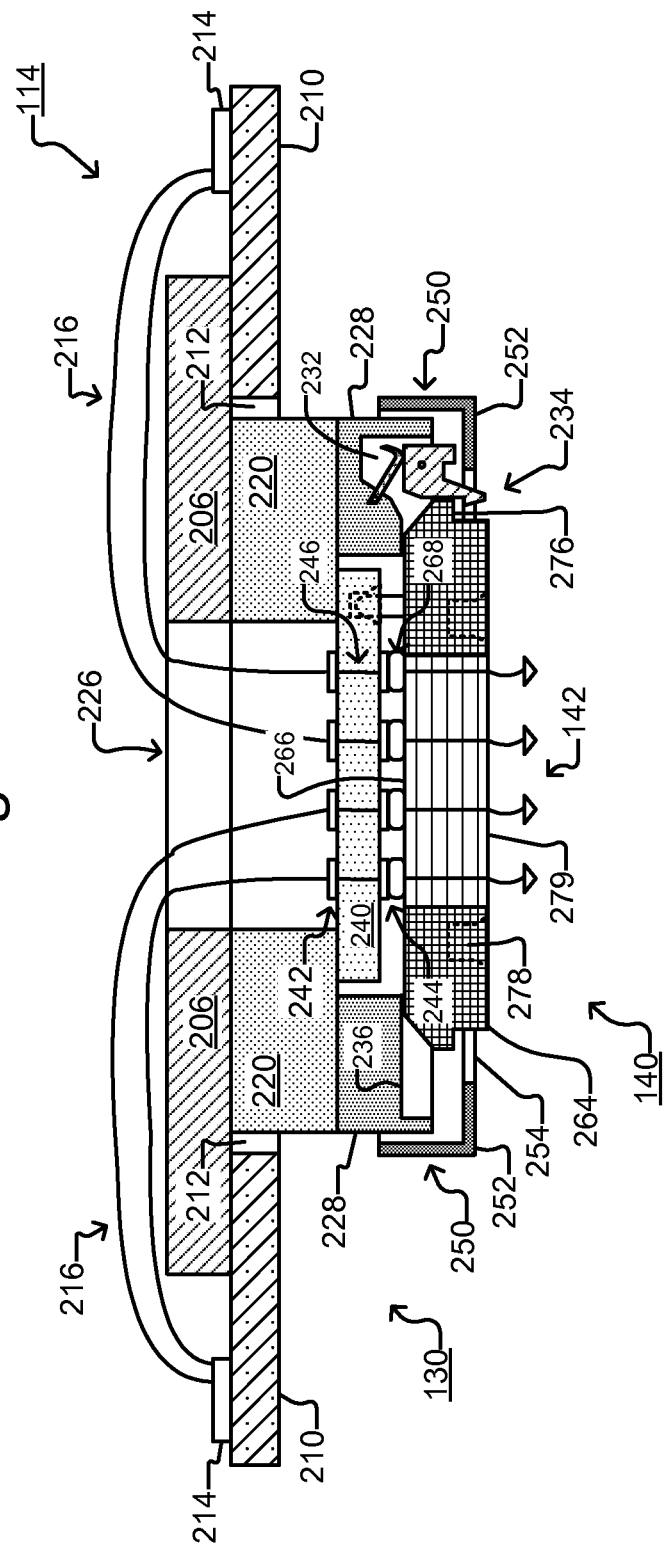
FIG. 3 is a side, cross-sectional view of a probe head attached to the primary sub-assembly of FIG. 2 forming a probe card apparatus according to some embodiments of the invention.
Figure 4:
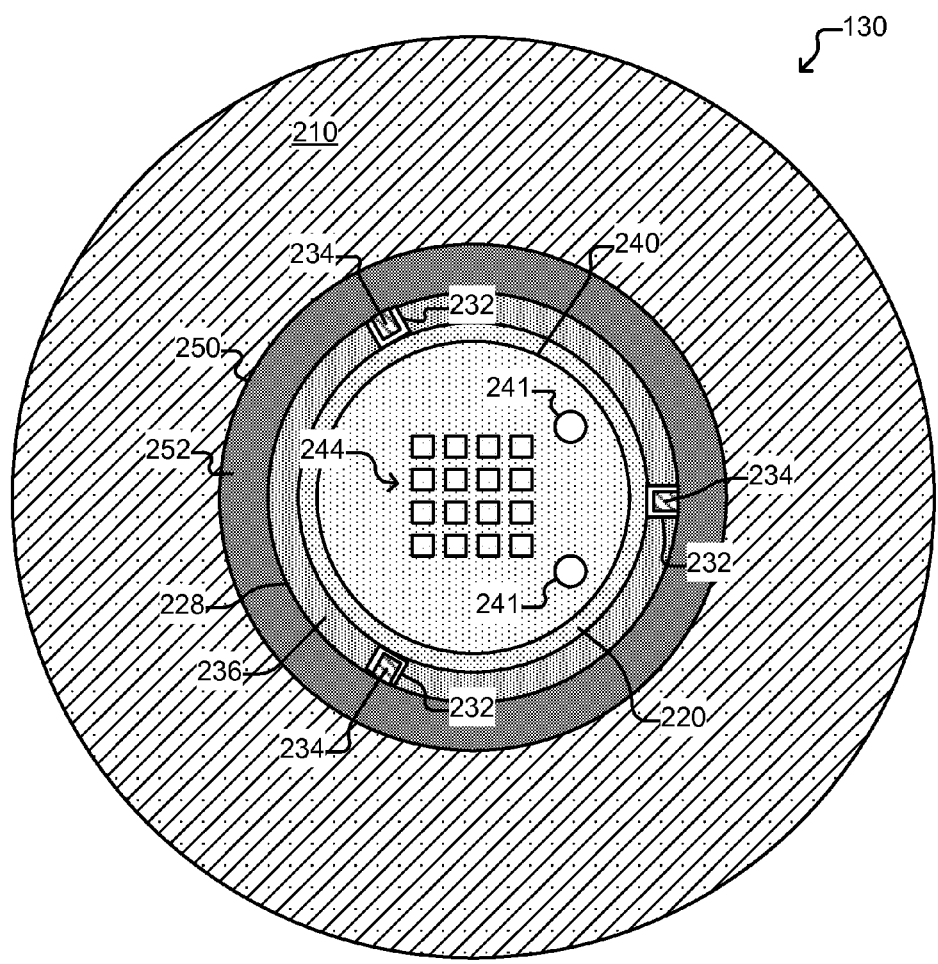
FIG. 4 is a bottom view of the primary sub-assembly of FIG. 2 according to some embodiments of the invention.
Figure 5:
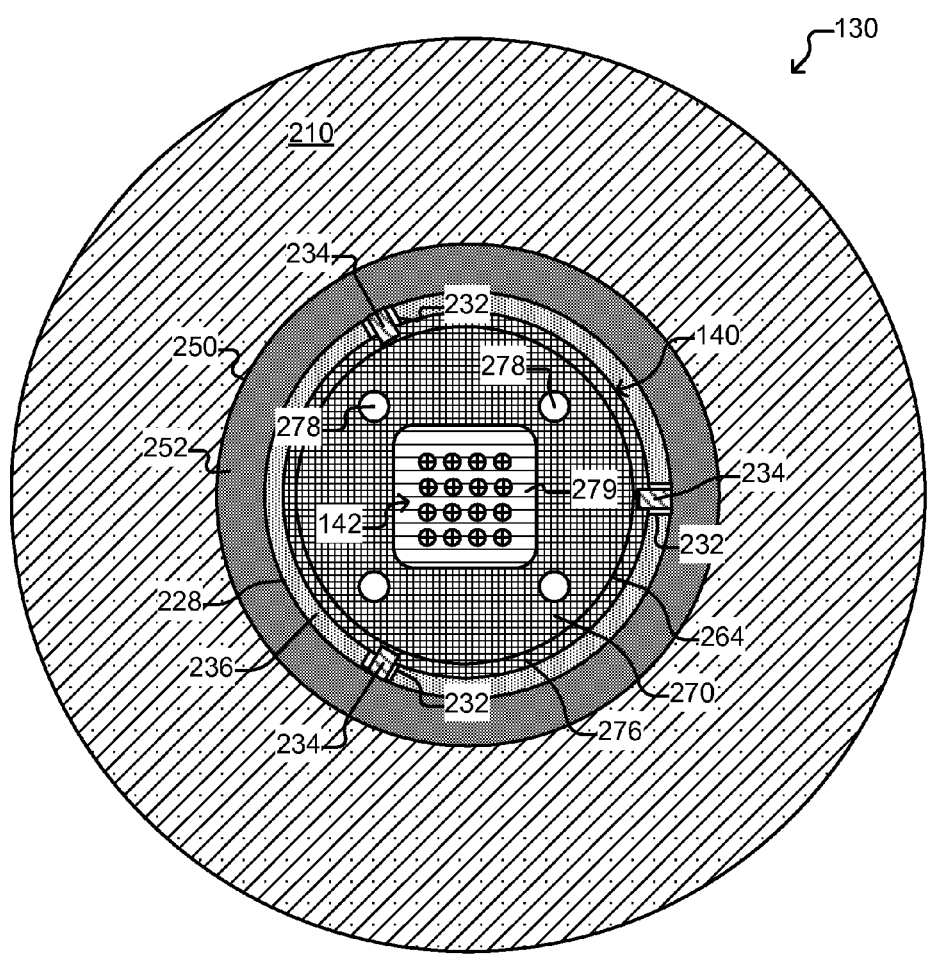
FIG. 5 is a bottom view of the probe card apparatus of FIG. 3 according to some embodiments of the invention.
Figure 6:
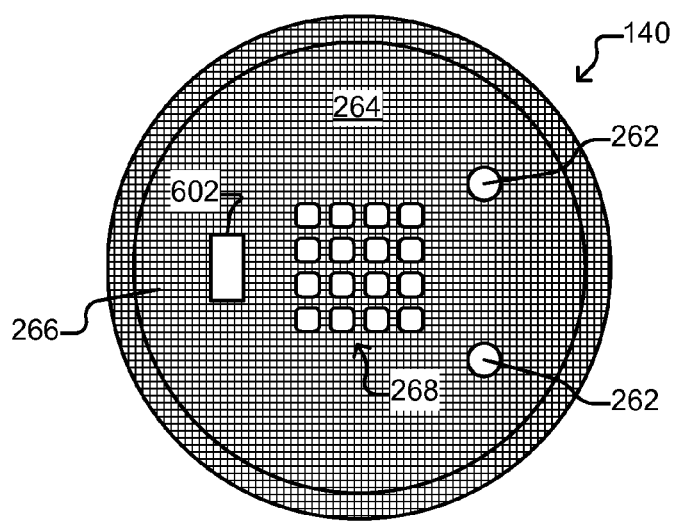
FIG. 6 is a top view of the probe head of FIG. 2 according to some embodiments of the invention.
Figure 7:
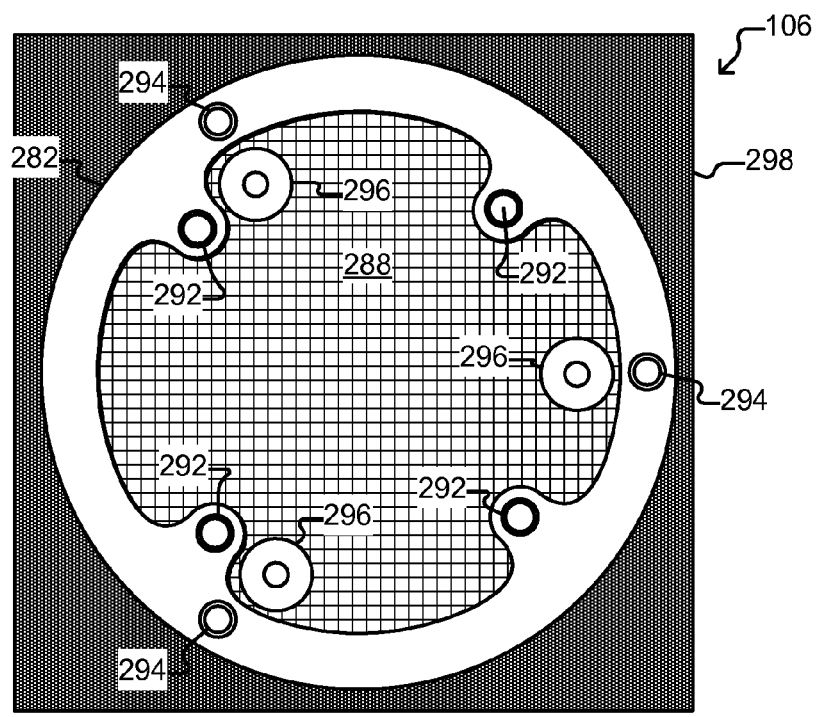
FIG. 7 is a top view of the tray of FIG. 2 according to some embodiments of the invention.

FIG. 2 illustrates in side, cross-sectional views example configurations of a primary sub-assembly 130, an interchangeable probe head 140, and a tray 106. FIG. 3 shows in a side, cross-sectional view the probe head 140 attached to the primary sub-assembly 130. FIG. 4 is a bottom view of the primary sub-assembly 130 without the probe head attached 140, and FIG. 5 is a bottom view showing the probe head 140 attached to the primary sub-assembly 130. FIG. 6 shows a top view of the probe head 140, a bottom view of which can be seen in FIG. 5. FIG. 7 is a top view of the tray 106. The illustrated configurations are examples only, and the primary sub-assembly 130, the interchangeable probe head 140, and tray 106 can be configured differently.

As shown in FIGS. 2-5, the primary sub-assembly 130 can comprise a stiffener 206, a wiring structure 210, a spacer 220, a base 228, a probe head interface 240, and a press ring 250. The elements illustrated in FIGS. 2-5 are but examples, and variations are possible. For example, the primary sub-assembly 130 need not include all of the elements shown, can include additional elements, and/or can include different elements. For example, as illustrated in FIGS. 8-16, the primary sub-assembly 130 need not include a press ring 250.

The stiffener 206 can comprise a mechanically rigid material (e.g., a metal). The stiffener 206 can thus provide mechanical rigidity. As shown, the stiffener 206 can have an opening 208, which can be a generally centrally located in the stiffener 206.

The wiring structure 210 can be, for example, a printed circuit board, a ceramic layered wiring substrate, or the like. The wiring structure 210 can comprise one or more tester interfaces 132 (see FIG. 1), and electrical connections 216 (e.g., wires) can electrical connect the tester interfaces 132 to electrical terminals 242 on the probe head interface 240. Alternatively, electrical connections (not shown but can be traces, vias, or the like) on or through the wiring structure 210 can electrically connect the tester interfaces 132 to the terminals 242. The wiring structure 210 can comprise an opening 212 (e.g., for the spacer 220), which can be generally centrally located in the wiring structure 210.

The spacer 220 can be a generally mechanically rigid structure and can be attached to the stiffener 206. Like the stiffener 206, the spacer 220 can include an opening 222, which can be generally centrally located in the spacer 220. The opening 208 of the stiffener 206 and the opening 222 of the spacer 220 can generally align and form a passage 226 (e.g., for the electrical connections 216) through the stiffener 206 and the spacer 222 to the probe head interface 240.

The base 228 can include an opening 230, which can be generally centrally located in the base 228 and can generally align with the passage 226. As shown, the opening 230 in the base 228 can be larger than the opening 222 in the spacer 220, which can allow the probe head interface 240 to be attached to the spacer 220. The base 228 can include an inner surface 236 against which the probe head 140 can be pressed while attached to the primary sub-assembly 130 (see FIG. 3). Alternatively, the probe head 140 can be located in proximity to but not necessarily touching the inner surface 236 while attached to the primary sub-assembly 130. The base 228 can also include recesses 232 and latch assemblies 234 (two are shown but there can be more) disposed in the recesses 232.

The spacer 220 and the base 228 can be distinct structures that are attached to each other (e.g., by bolts, screws, clamps, adhesives, or the like). Alternatively, the spacer 220 and the base 228 can be a single structure. For example, the spacer 220 and the base 228 can be portions of the same monolithic structure.

The probe head interface 240 can comprise the electrical terminals 242 discussed above on one side, electrical contacts 244 on the other side, and electrical connections 246 from the terminals 242 to the contacts 244. The probe head interface 240 can be attached to the spacer 220 with the terminals 242 disposed in the passage 226 and the contacts 244 in the opening 230 of the base 228.

While the probe head 140 is in a "latching position" in contact with or at least proximity to the sub-assembly 130, the latch assemblies 234, while closed (e.g., latched), can attached the probe head 140 to the primary sub-assembly 130 with electrical connectors 268 of the probe head 140 electrically connected to (e.g., in contact with) the contacts 244 of the probe head interface 240. While open (e.g., unlatched), however, the latch assemblies 234 can allow the probe head 140 to be removed and thus detached from the primary sub-assembly 130. The latch assemblies 234 can be configured to be closed unless opened by the force of the press ring 250 being pressed against the latch assemblies 234. Alternatively, if the sub-assembly 130 does not include a press ring 250, the latch assemblies 234 can open the latch assemblies 234 by directly contacting the latch assemblies 234.

The press ring 250 can comprise an opening 254 (e.g., a centrally located opening) and a lip 252. The press ring 250 can be moveably attached to, for example, the base 228. The press ring 250 can be biased into a default position in which the lip 252 does not apply a significant force or even contact the latch assemblies 234. The lip 252, however, can be disposed adjacent to the latch assemblies 234 so that, while the press ring 250 is acted upon by a sufficient and properly oriented force, the lip 252 can be moved into contact with and press the latch assemblies 234 sufficiently to open the latch assemblies 234. When the force is removed, the biasing of the press ring 250 (discussed above) can automatically move the press ring 250 out of contact with the latch assemblies 234 (e.g., back to the default position). As noted, some embodiments of the primary sub-assembly 130 do not include the press ring 250.

As shown in FIGS. 2, 3, 5, and 6, the interchangeable probe head 140 can comprise a base structure 264 and a probe insert 279.

The base structure 264 can comprise a catch 276, guide holes 278, and guide pins 262. The catch 276 can interlock with the latch assemblies 234 of the primary sub-assembly 130. The catch 276 can comprise a continuous feature along a perimeter of the base structure 264 as illustrated in FIGS. 5 and 6. As another example, there can be multiple discrete catches 276 disposed around a perimeter of the base structure 264. Regardless, while closed, the latch assemblies 130 can interlock with the catch 276 (or catches) and thereby attach the probe head 140 to the primary sub-assembly 130 as discussed above. The guide holes 278 (two are shown but there can be more) can correspond to guide pins 292 on the tray 106. While the probe head 140 is disposed on the tray 106, the guide pins 292 can be inserted into the guide holes 278. Similarly, the guide pins 262 (one is shown but there can be more) can correspond to guide holes 241 in the probe head interface 240. As the tray 106 moves the probe head 140 into contact with the probe head interface 240, the guide pins 262 can enter the guide holes 241. Alternatively, one or more of the guide pins 292 can be on the probe head 140 and corresponding guide hole(s) 278 can be in the tray 106. Similarly, one or more of the guide pins 262 can be on the probe head interface 240 and corresponding guide hole(s) 241 can be in the probe head 140.

The guide holes 241, 278 and the guide pins 262, 292 can be examples of alignment features. Inserting a guide pin 262, 292 into a corresponding guide hole 241, 278 can be an example of coupling alignment features.

The probe insert 279 can be attached to the base structure 264. For example, the probe insert 279 can be disposed in a central opening (not shown) in the base structure 264. Bolts, screws, clamps, adhesive, springs (e.g., leaf springs), and/or the like can attached the probe insert 279 to the base structure 264. Regardless, the probe insert 279 can comprise electrical connectors 268 on one side 266 of the probe head 140 and electrical probes 142 extending from the other side 270 of the probe head 140. Electrical connections 274 can connect the connectors 268 to the probes 142. The number and pattern of the connectors 268 can correspond to the number and pattern of the contacts 244 of the probe head interface 240. While the probe head 140 is attached to the primary sub-assembly 130, the connectors 268 can thus be electrically connected to (e.g., in physical contact with) the contacts 244. The number and pattern of the probes 142 can correspond to the number and pattern of the terminals 152 of the DUT 150 to be tested. The probes 142, connections 274, connectors 268, contacts 244, connections 246, terminals 242 and connections 216 can thus form individual electrical connections between the terminals 152 of a DUT 150 and the tester interface 132 and thus the test controller 114 while the tester interface 132 is connected to the test controller 114 and the probes 142 are in contact with the DUT terminals 152.

In some embodiments, the probe head 140 can comprise an identifier 602, which can uniquely identify the probe head 140. The identifier 602 can be, for example, a machine readable tag such as a bar code, a radio frequency (RF) transmitter, or the like. If the probe head 140 has an identifier 602, the test system 100 can verify the identity of the probe head 140 before attaching the probe head 140 to the primary sub-assembly 130.

As shown in FIGS. 2 and 7, the tray 106 can comprise a first moveable stage 282 and a second moveable stage 288, which can be disposed, for example, on a base 298. Both stages 282, 288 can be independently moved away from and back to the base 298. For example, actuators (not shown in FIG. 2; elements 812, 814 in one or more of FIGS. 8-14) can independently move the first stage 282 and the second stage 288. The first stage 282 can comprise an opening 284 (e.g., a central opening), and the second moveable stage 288 can be disposed in the opening 284. As noted, the stages 282, 288 can be moveable with respect to each other.

The first stage 282 can comprise guide pins 292 and latch studs 294 (two are shown but there can be more). A probe head 140 can be disposed on the first stage 282, and the guide pins 292 can fit into the guide holes 278 in the probe head 140. The latch studs 294 can be positioned to correspond to the press ring 250 and thus contact and press the press ring 250 against the latch assemblies 234 sufficiently to open the latch assemblies 234 as the first stage 282 moves toward and then into contact with the primary sub-assembly 130. As noted, the latch studs 294 can instead be positioned to contact the latch assemblies 234 directly if, for example, the primary probe card apparatus 130 does not include a press ring 250. Regardless, the latch studs 294 can be sized (e.g., extend a distance D from the first stage 282) with respect to a thickness $T_1$ of the probe head 140 and positioned with respect to the guide pins 292 onto which the probe head 140 can be disposed so that, as the first stage 282 with a probe head 140 disposed thereon, moves toward the primary sub-assembly 130, the latch studs 294 contact the primary sub-assembly 130 and open the latch assemblies 234 before the probe head 140 reaches the latch assemblies 234. Thus, as the first stage 282 moves a probe head 140 toward the primary sub-assembly 130, the latch studs 294 open the latch assemblies 234 before the probe head 140 arrives at the latch assemblies 234 so that, as the probe head 140 reaches and then passes by the latch assemblies 234, the latch assemblies 234 are open.

The second stage 288 can comprise compression mechanisms 296, which while pressed against the second side 270 of the probe head 140 can press the probe head 140 against the inner surface 236 of the base 228 of the primary sub-assembly 130 and/or the contacts 244. The compression mechanisms 296 can comprise, for example, springs. Thus, for example, the compression mechanisms 296 can hold the probe head 140 in the latching position discussed above.

FIGS. 8-13 illustrate an example of attaching a probe head 140 to the primary sub-assembly 130, and FIGS. 13-16 show an example of detaching a probe head 140 from the primary sub-assembly 130. In FIGS. 8-16, the primary sub-assembly 130, probe head 140, and tray 106 are shown in partial, side, cross-sectional views. That is, in FIGS. 8-16 only a portion of the foregoing elements on the right-hand portion of the page in FIG. 2 are shown. As can be seen, the primary sub-assembly 130 illustrated in FIGS. 8-16 does not include the press ring 250. Instead, the latch studs 294 open the latch assemblies 234 by contacting and pressing directly against the latch assemblies 234 rather than directly contacting and pressing the press ring 250 against the latch assemblies 234 and thereby indirectly contacting and pressing the latch assemblies 234 through the press ring 250.

Figure 8:
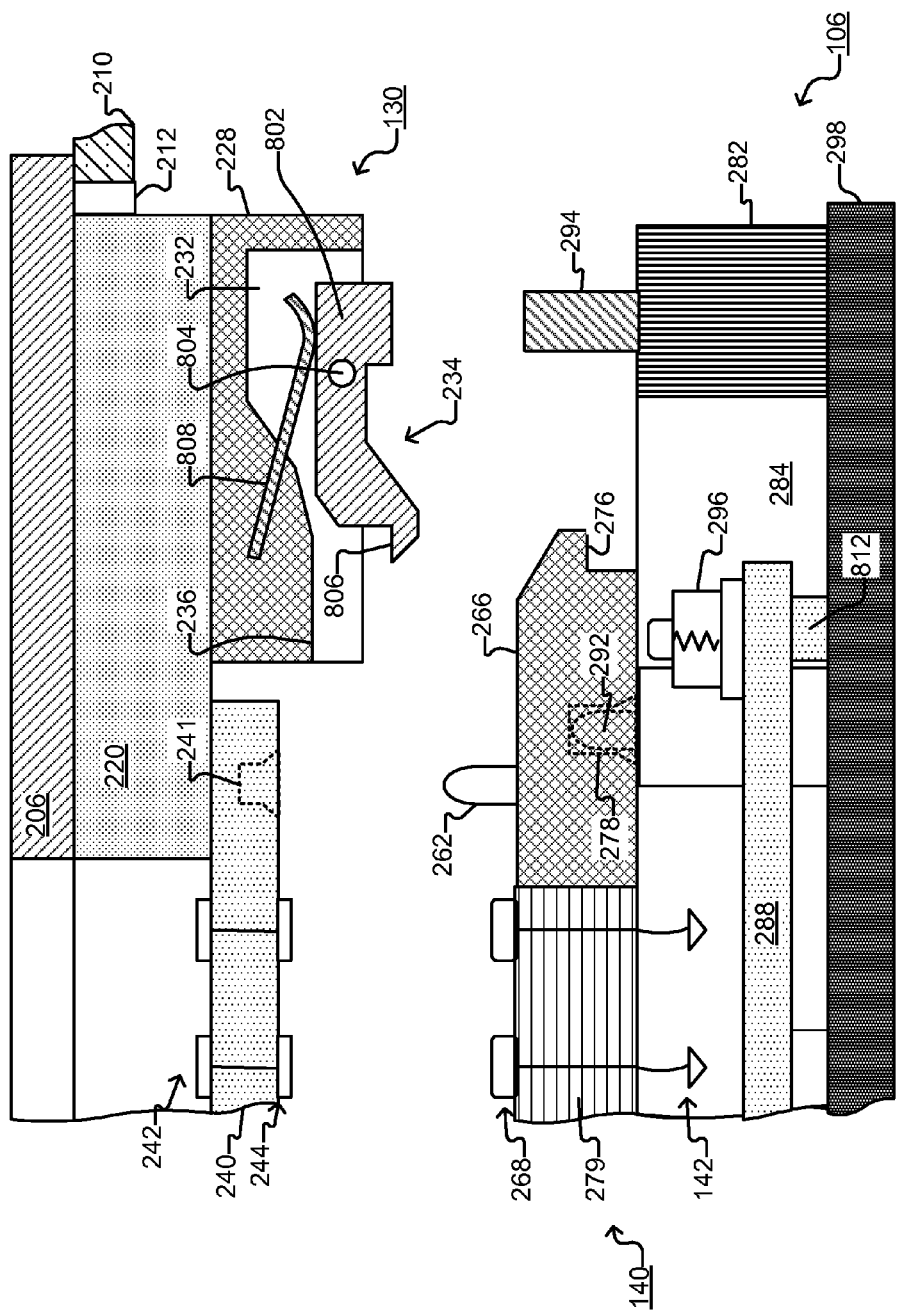
FIGS. 8-13 illustrate an example of automated attaching of an interchangeable probe head to a primary sub-assembly resulting in a fully assembled probe card apparatus according to some embodiments of the invention.

As noted, FIGS. 8-13 show an example of attaching a probe head 140 to the primary sub-assembly 130. FIG. 8 shows a probe head 140 disposed on the tray 106, which is positioned adjacent (e.g., below) the primary sub-assembly 130. As shown, the probe head 140 can be disposed on the first stage 282 of the tray 106 with guide pins 292 of the first stage 282 inserted into the guide holes 278 in the probe head 140.

Figure 9:
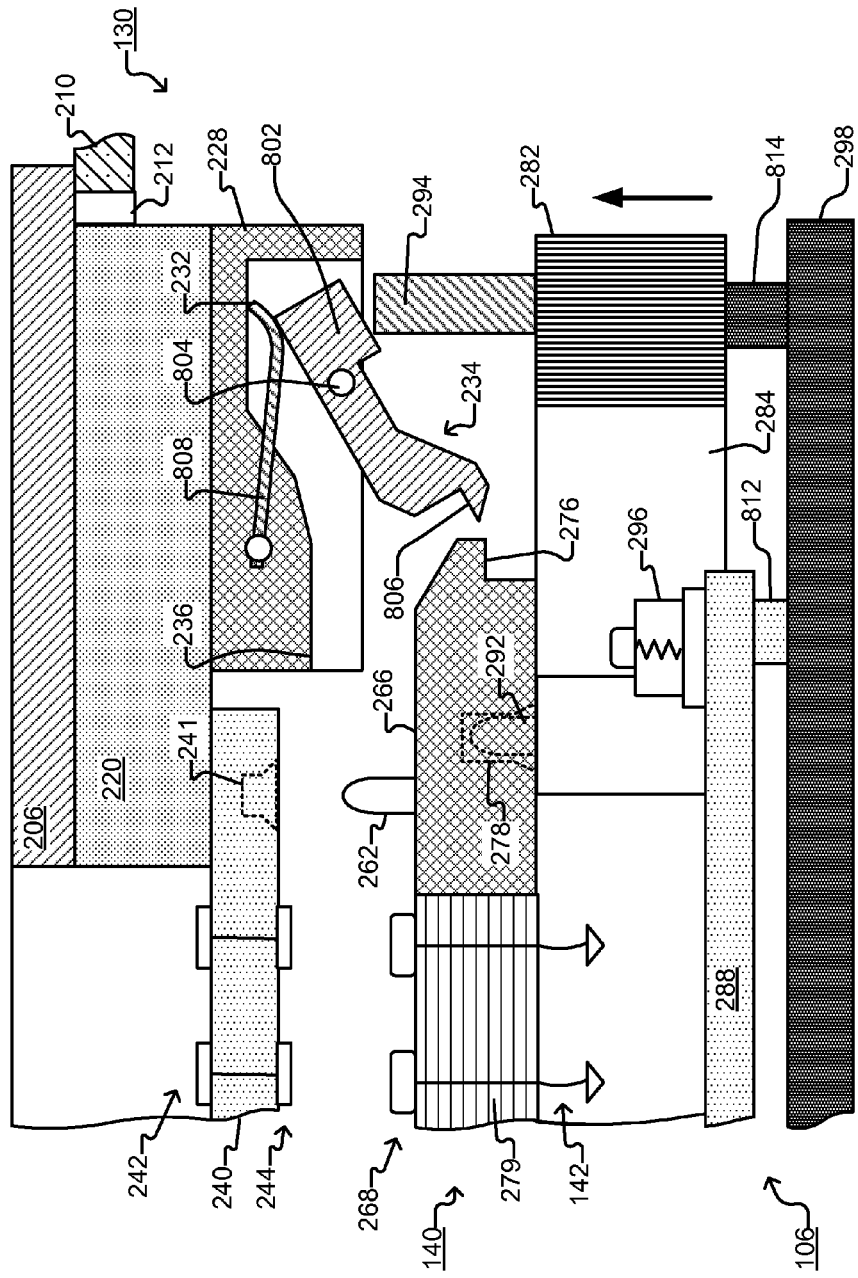

In FIG. 9, the first stage 282 is moved toward the primary sub-assembly 130, for example, by actuators 814 (one is shown but there can be more). As the first stage 282 moves toward the primary sub-assembly 130, initial contact can be the latch studs 294 contacting and pressing the latch assemblies 234, which as discussed above, can open the latch assemblies 234. For example, as shown, each latch assembly 234 can comprise a latch 802 that can rotate about a rotation mechanism 804 (e.g., a rod) and a return mechanism 808 (e.g., a mechanical spring). The return mechanism 808 can, for example, bias a latch 802 so that the latch 802 returns to its default closed position absent a force from a latch stud 294.

As the latch stud 294 moves into contact with a latch 802, the latch stud 294 rotates the latch 802, opening the latch assembly 234. As the first stage 282 continues moving toward the primary sub-assembly 130, the probe head 140 passes the now open latches 234 and engages the primary sub-assembly 130. For example, guide pins 262 on the first side 266 of the probe head 140 can enter corresponding guide holes 241 in the probe head interface 240, and the connectors 268 of the probe head 140 can electrically connect (e.g., by coming into physical contact) with the terminals 244 on the probe head interface 240 of the primary sub-assembly 130. As another example, the first surface 266 of the probe head 140 can contact the inner surface 236 of the base 228.

Figure 10:
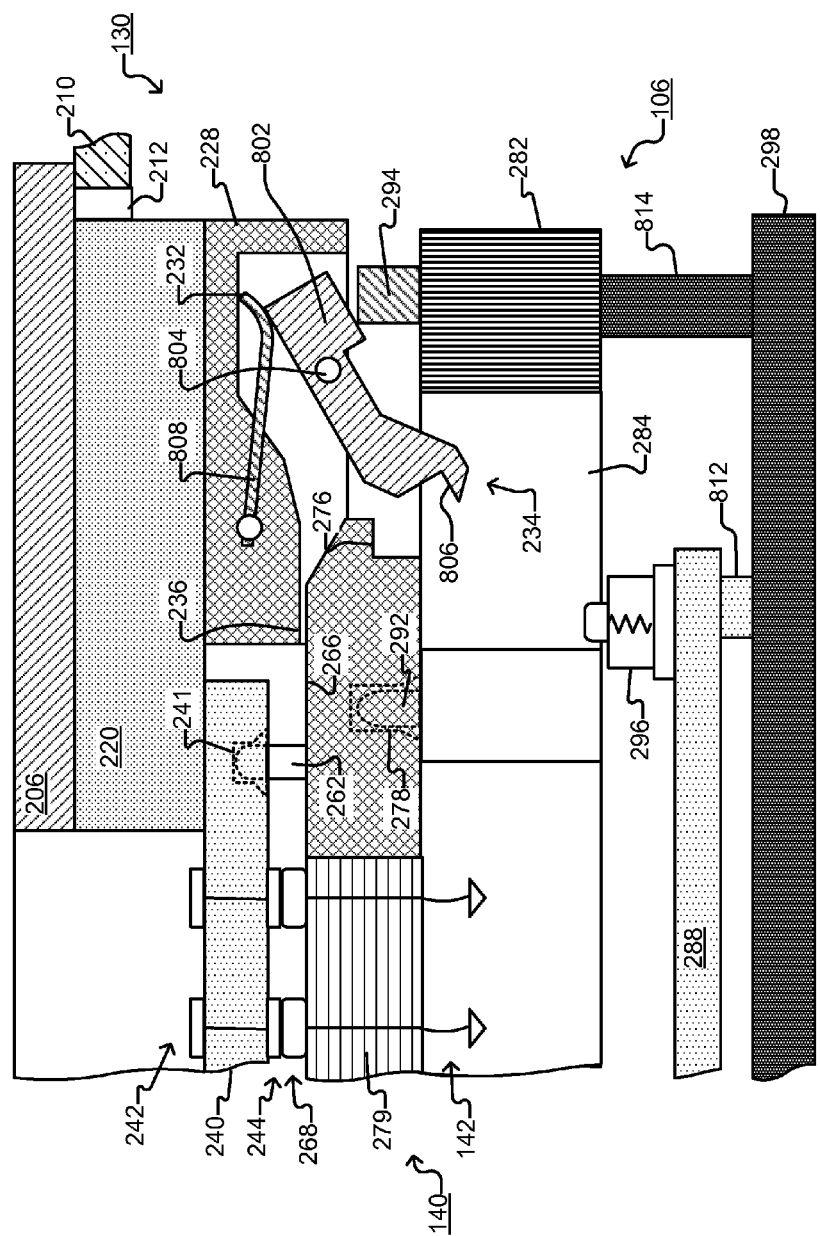

The guide pins 262 extending from the probe head 140 and the corresponding guide holes 241 in the probe interface 240 can be positioned with respect to the latch assemblies 234 so that the probe head 140 is in a "latching position" in which the catch 276 of the probe head 144 is positioned to interlock with corresponding catches 806 on the latches 802 of the latch assemblies 234 thereby attaching the probe head 140 to the primary sub-assembly 130. The first stage 282, moved as shown in FIG. 9, can thus open the latch assemblies 234 and place the probe head 144 in a latching position as shown in FIG. 10.

Figure 11:
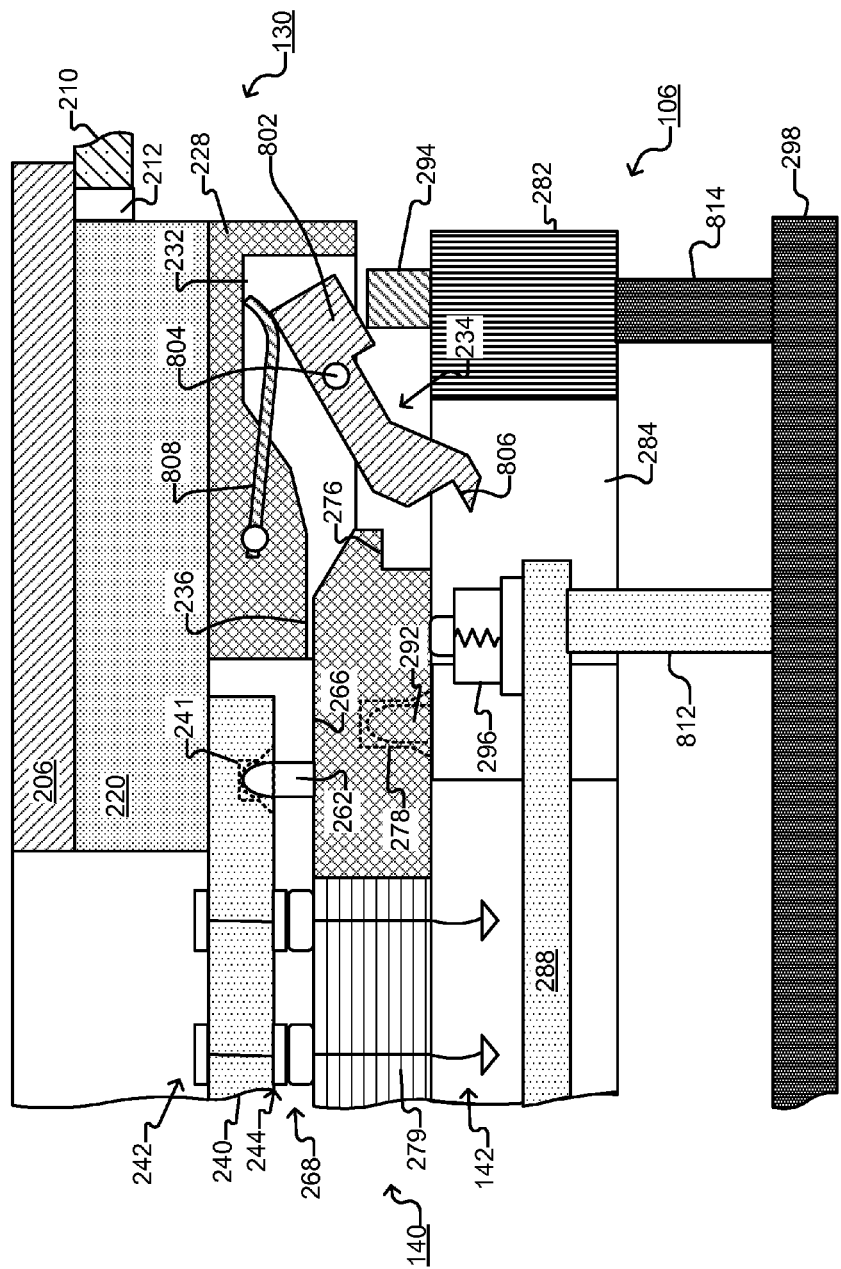

As shown in FIG. 11, the second stage 288 can then be moved (e.g., by actuators 812 (one is shown but there can be more)) toward the probe head 144 to thereby press the compression mechanisms 296 against the second side 270 of the probe head 140, which can hold the probe head 140 in the latching position independent of the first stage 282.

Figure 12:
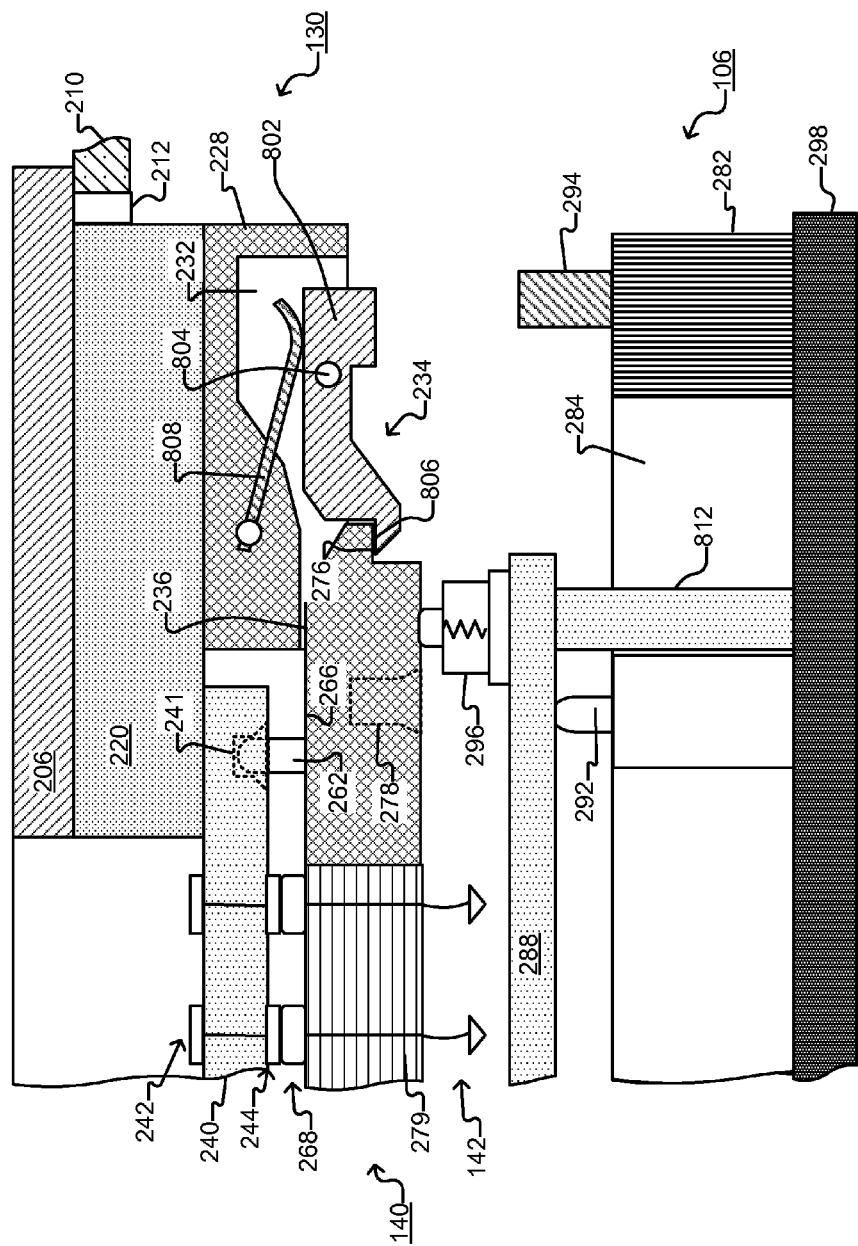

As shown in FIG. 12, while the second stage 288 holds the probe head 140 in the latching position, the first stage 282 can be moved away from and out of contact with the probe head 140, which moves the latch studs 294 away from and out of contact with the latch assemblies 234. The return mechanisms 808 can cause the latch assemblies 234 to close (as discussed above). The latch assemblies 234 thus close on and latch the catch 276 of the probe head 140, which attaches the probe head 140 to the primary sub-assembly 130.

Figure 13:
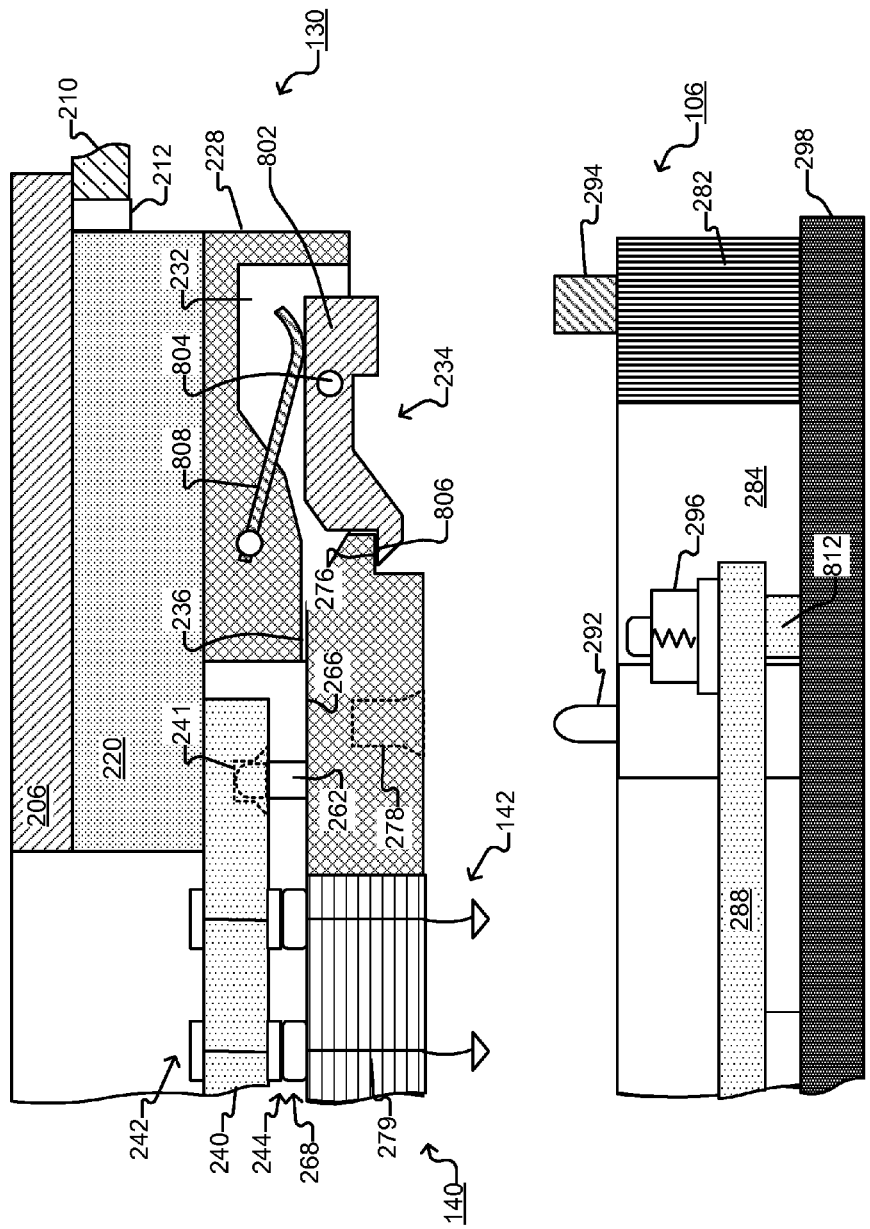

As shown in FIG. 13, the second stage 288 can then be moved away from and out of contact with the probe head 140. The result can be, as shown in FIG. 13, the probe head 140 attached to the primary sub-assembly 130 with the connectors 268 of the probe head 140 electrically connected to the contacts 244 of the probe head interface 240. The guide pins 262 of the probe head 140 can also be inserted into the guide holes 241 in the probe head interface 240.

FIGS. 13-16 show an example of detaching a probe head 140 from the primary sub-assembly 130. As noted, FIG. 13 shows a probe head 140 attached to the primary sub-assembly 130. To detach the probe head 140, an empty tray 106 can be positioned adjacent (e.g., below) the probe head 140 as also shown in FIG. 13.

Figure 14:
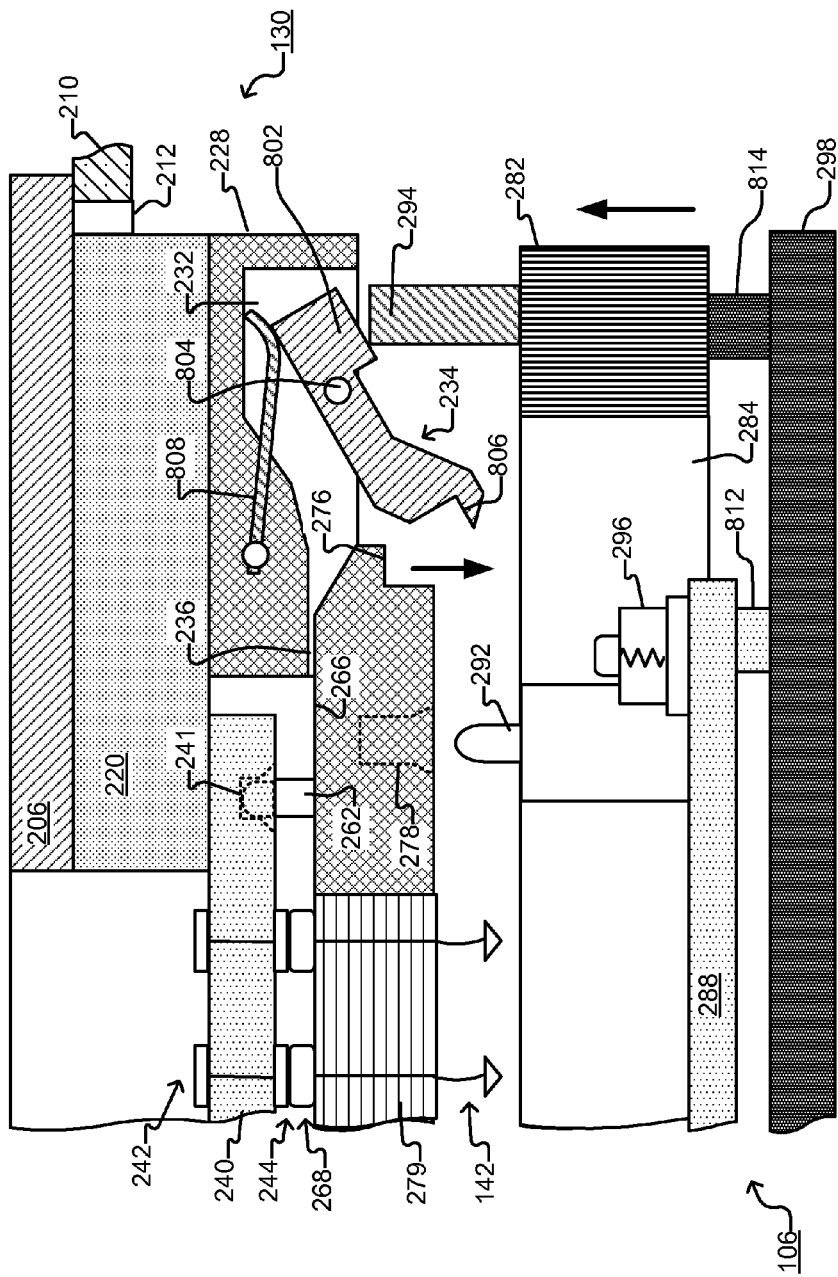
FIGS. 14-16 show an example of automated detaching of an interchangeable probe head from the primary sub-assembly according to some embodiments of the invention.

In FIG. 14, the first stage 282 is moved toward the primary sub-assembly 130 and the probe head 140 by actuators 814. As the first stage 282 moves toward the primary sub-assembly 130, initial contact can be the latch studs 294 contacting and pressing the latch assemblies 234, which as discussed above, can open the latch assemblies 234. As a latch stud 294 presses against a latch 802, the latch stud 294 rotates the latch 802, opening the latch assembly 234. This can release the probe head 140, which can be released (e.g., drop) onto the first stage 282 generally as shown in FIG. 14.

Figure 15:
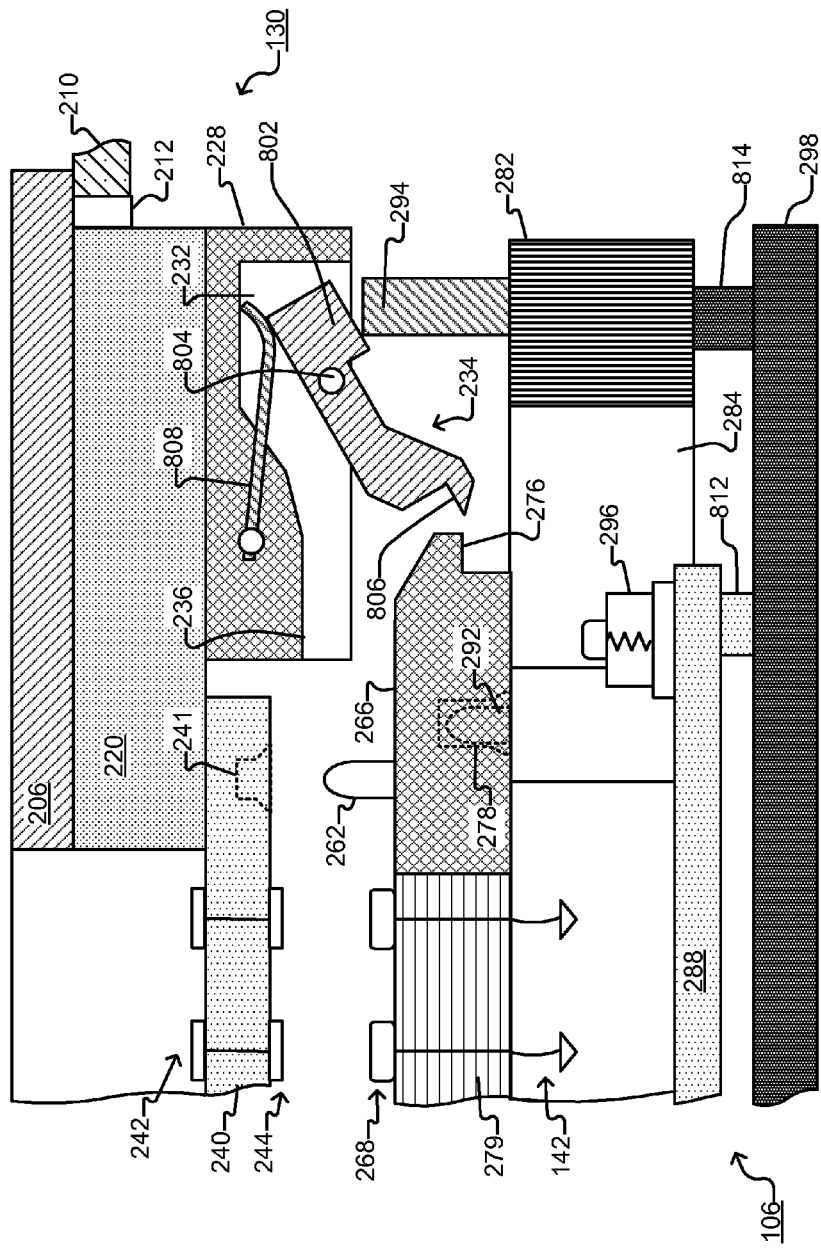
Figure 16:
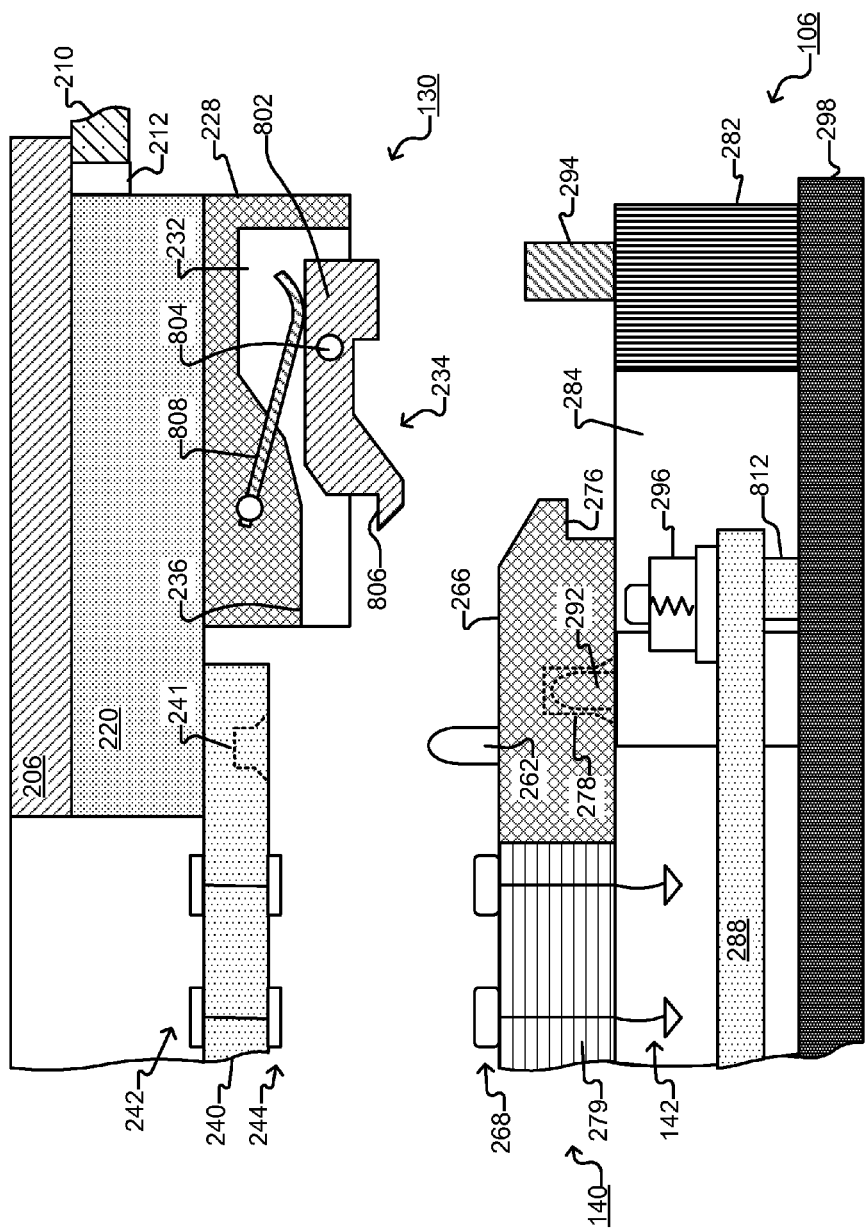

As shown in FIG. 15, the first stage 282, with the probe head 140 now disposed thereon, can be moved away from primary sub-assembly 130. As the first stage 182 moves away from the primary sub-assembly 130, the first stage 282 and probe head 140 pass the still open latches 234. As the first stage 282 continues to move away from the primary sub-assembly 130, the latch studs 294 move out of contact with the latches 802, and the return mechanisms 808 can then return the latches 802 to their closed positions. By then, however, the first stage 282 has moved the probe head 140 past the latch assemblies 234 and away from the primary sub-assembly 130. As shown in FIG. 16, the probe head 140 has thus been detached from the primary subassembly 130.

Although specific embodiments and applications of the invention have been described in this specification, these embodiments and applications are exemplary only, and many variations are possible.

We claim:

1. A probing apparatus comprising:
a probe head comprising:
electrical connectors on one side thereof,
electrically conductive probes extending from another side thereof and electrically connected to said connectors, and
a catch for interlocking with latch assemblies of a primary sub-assembly of a probe card apparatus while said probe head is moved towards the primary sub-assembly so that the probe head is in a latching position with respect to said primary sub-assembly;
wherein:
said probe head is configured to be attached to said primary sub-assembly by closing said latch assemblies while said probe head is in said latching position, and
said probe head is configured to be detached from said primary sub-assembly by opening said latch assemblies;
further comprising a tray configured to hold said probe head while said probe head is detached from said primary sub-assembly, wherein said tray is configured to contact and thereby automatically open said latch assemblies as said tray moves said probe head toward said latching position.

2. The probing apparatus of claim 1, wherein said tray comprises:
a first moveable stage configured to hold said probe head with alignment features of said probe head coupled with corresponding alignment features of said tray, and said first stage further comprising a latch stud configured to open said latch assemblies of said primary sub-assembly as said first stage moves said probe head toward said primary sub-assembly before said probe head reaches said latch assemblies.

3. The probing apparatus of claim 2, wherein said tray further comprises a second moveable stage for temporarily holding said probe head in said latching position while said latch assemblies are open.

4. The probing apparatus of claim 3, wherein:
said first stage comprises an opening, and
said second stage is disposed in said opening.

5. The probing apparatus of claim 1, wherein said tray is configured to automatically close said latch assemblies as said tray moves away from said primary sub-assembly and out of contact with said latch assemblies.

6. The probing apparatus of claim 1, wherein said probe head comprises a machine readable identifier for uniquely identifying said probe head.

7. A probe apparatus, comprising:
a probe head comprising:
electrical connectors on one side thereof;
electrically conductive probes extending from another side thereof and electrically connected to said connectors;
a catch for interlocking with latch assemblies of a primary sub-assembly of a probe card apparatus while said probe head is in a latching position with respect to said primary sub-assembly;
a first alignment feature configured to couple with a corresponding alignment feature of said primary sub-assembly while said probe head is in said latching position; and
a second alignment feature configured to couple with a corresponding alignment feature of a tray, wherein said tray is configured to automatically open and close said latch assemblies of said primary sub-assembly as said tray is moved into and out of contact with said primary sub-assembly;
wherein the probe head is configured to be attached to said primary sub-assembly by closing said latch assemblies while said probe head is in said latching position, and said probe head is configured to be detached from said primary sub-assembly by opening said latch assemblies.

8. A probing apparatus comprising:
a probe head comprising:
electrical connectors on one side thereof,
electrically conductive probes extending from another side thereof and electrically connected to said connectors, and
a catch for interlocking with latch assemblies of a primary sub-assembly of a probe card apparatus while said probe head is moved towards the primary sub-assembly so that the probe head is in a latching position with respect to said primary sub-assembly;
wherein:
said probe head is configured to be attached to said primary sub-assembly by closing said latch assemblies while said probe head is in said latching position, and
said probe head is configured to be detached from said primary sub-assembly by opening said latch assemblies;
further comprising a tray, wherein said tray comprises:
a first moveable stage configured to hold said probe head with alignment features of said probe head coupled with corresponding alignment features of said tray, and said first stage further comprising a latch stud configured to open said latch assemblies of said primary sub-assembly as said first stage moves said probe head toward said primary sub-assembly before said probe head reaches said latch assemblies.

* * * * *